United States Patent [19]

Fukai et al.

[11] 4,352,440

[45] Oct. 5, 1982

[54] APPARATUS FOR TRANSPORTING ELECTRONIC COMPONENTS OR THE LIKE FROM ONE LOCATION TO ANOTHER IN ALIGNMENT

[75] Inventors: Kikuji Fukai; Hideo Shirouchi, both of Takasaki, Japan

[73] Assignee: Taiyo Yuden Co., Ltd., Tokyo, Japan

[21] Appl. No.: 153,003

[22] Filed: May 27, 1980

[30] Foreign Application Priority Data

Jun. 25, 1979 [JP] Japan .................................. 54/79957

[51] Int. Cl.³ ........................ B65G 57/16; B65G 61/00
[52] U.S. Cl. .................................... 221/178; 198/396; 198/443; 222/182; 222/298
[58] Field of Search ............... 221/156, 160, 161, 168, 221/178, 179, 180, 182, 211, 298; 198/390, 396, 409, 443; 414/210, 304, 752, 783

[56] References Cited

U.S. PATENT DOCUMENTS

| | | | |
|---|---|---|---|
| 1,329,787 | 2/1920 | Mackey | 221/156 |
| 2,350,486 | 6/1944 | Bailey | 221/160 |
| 2,937,788 | 5/1960 | Darsie | 221/298 |
| 3,085,713 | 4/1963 | Reiners | 221/211 X |
| 3,152,720 | 10/1964 | Maloney et al. | 221/211 X |
| 3,907,008 | 9/1975 | Bates et al. | 140/105 |

Primary Examiner—Jeffrey V. Nase
Attorney, Agent, or Firm—Woodcock, Washburn, Kurtz, Mackiewicz & Norris

[57] ABSTRACT

An apparatus for particular use in delivering leadless, tubular ceramic capacitors or like electronic components from a receptacle, containing a random pile of such components, to templates for the prearrangement of the components, preparatory to their attachment to printed circuit boards. The apparatus includes a vacuum pickup assembly for repeatedly picking up the components, at least one at a time, in the receptacle and depositing them on an entrance guide of approximately V-shaped cross section extending from an inclined, rotatable, tubular chute. The entrance guide functions to direct the components into the chute in alignment, for delivery to a desired location. After the pickup assembly deposits a component or components on the entrance guide each time, the entrance guide and the chute are bidirectionally rotated through a preassigned angle in each direction to facilitate the entrance of the component or components into the chute.

14 Claims, 13 Drawing Figures

(A) SUCTION BY PICKUP ASSEMBLY 52

(B) VERTICAL DRIVE CYLINDER 68 IN EXTENSION (C) CONTRACTION OF HORIZONTAL DRIVE CYLINDER 74

(D) EXTENSION OF HORIZONTAL DRIVE CYLINDER 74

(E) DESCENT OF PICKUP ASSEMBLY 52

(F) OPERATION OF RACK CYLINDER 96

APPARATUS FOR TRANSPORTING ELECTRONIC COMPONENTS OR THE LIKE FROM ONE LOCATION TO ANOTHER IN ALIGNMENT

BACKGROUND OF THE INVENTION

Our invention deals with an apparatus for the transfer of articles from one location to another in a row. More specifically, our invention concerns such an apparatus suitable for transporting cylindrical or tubular articles such as some electronic components from one location, where they may be contained in a receptacle in random arrangement, to another location in an aligned manner. The apparatus according to our invention finds a typical application in automatically delivering leadless, tubular ceramic capacitors (i.e., those without leads) to printed circuit boards, or to templates for prearrangement of such electronic components to be attached to printed circuit boards, in the manufacture of printed circuit assemblies.

Heretofore, for attachment of electronic components to printed circuit boards, the usual practice has been to insert the leads of the components into and through holes formed in the boards and to solder the leads to the printed circuit patterns. U.S. Pat. No. 3,907,008 to Bates et al. represents an example of conventional apparatus used for that purpose. With the components mounted in position on printed circuit boards with their leads bent into required shape, however, the resulting circuit assemblies are not so small in size as can be desired.

Of recent development, the leadless, tubular ceramic capacitor provides a partial solution to the above problem. The capacitor comprises a tubular ceramic body and a pair of electrodes formed thereon. The electrodes can be coupled directly to the printed circuit pattern on a circuit board, with the consequent reduction in the size of the circuit assembly. Because of the absence of leads, however, such capacitors do not permit prearrangement with the use of leads, which has been practiced with the usual components having leads. The advent of the apparatus has therefore been awaited which is capable of automatically delivering such leadless electronic components to desired positions on printed circuit boards or on templates for prearrangement of the components.

As fas as we are aware, the prior art closest to our invention is the apparatus for delivering bolt and nut blanks to machines for shaping them into bolts and nuts. The apparatus includes a kind of hopper or chute, which is thrusted into a random pile of the blanks and then turned upward for the delivery of the blanks therethrough. This known apparatus does not lend itself to use with electronic components, however, because of unavoidable damage to the components.

SUMMARY OF THE INVENTION

In view of the above state of the art we aim at the provision of an apparatus capable of automatically transferring desired articles such as electronic components from one location, where they may lie in the form of a random pile, to another in a row or in alignment, without the least damage to the articles.

The apparatus according to our invention comprises pickup means for repeatedly picking up articles, at least one at a time, received in a receptacle and for depositing the articles on an entrance guide of substantially V-shaped cross section extending from the entrance end of an inclined chute. The entrance guide functions to direct the articles into the chute, which accepts only one article at a time and transports the successive articles therethrough toward a desired location in a row. The apparatus further comprises means for facilitating the entrance of the articles from the entrance guide into the chute.

In the preferred embodiment disclosed herein, in which the apparatus is adapted for use with leadless, tubular ceramic capacitors, the pickup means comprises a vacuum pickup assembly for picking up the capacitors by suction. The configuration of the entrance guide is well calculated to direct such tubular or cylindrical articles into the chute in alignment. Further, for facilitating the entrance of the articles from the entrance guide into the chute, the entrance guide and the chute are supported for joint rotation about the axis of the chute. Preferably, after the pickup assembly deposits one or more articles on the entrance guide each time, the entrance guide and the chute are rotated about 90 degrees or more in one direction and then through the same angle in the opposite direction. Thus the articles that will not readily enter the chute can be dropped off the entrance guide to prevent jamming.

The above and other objects, features and advantages of our invention will become more apparent from a study of the following description, in which reference is directed to the attached drawings.

DESCRIPTION OF THE PREFERRED EMBODIMENT

The apparatus according to our invention will now be disclosed in detail as adapted specifically for transferring small-sized, cylindrical or tubular electronic components, typically leadless ceramic capacitors, from one location to another. The apparatus finds particular utility in delivering such leadless electronic components to desired positions on templates, preliminary to the transfer of the components from the templates onto printed circuit boards with the use of an adhesive.

Figure 1:
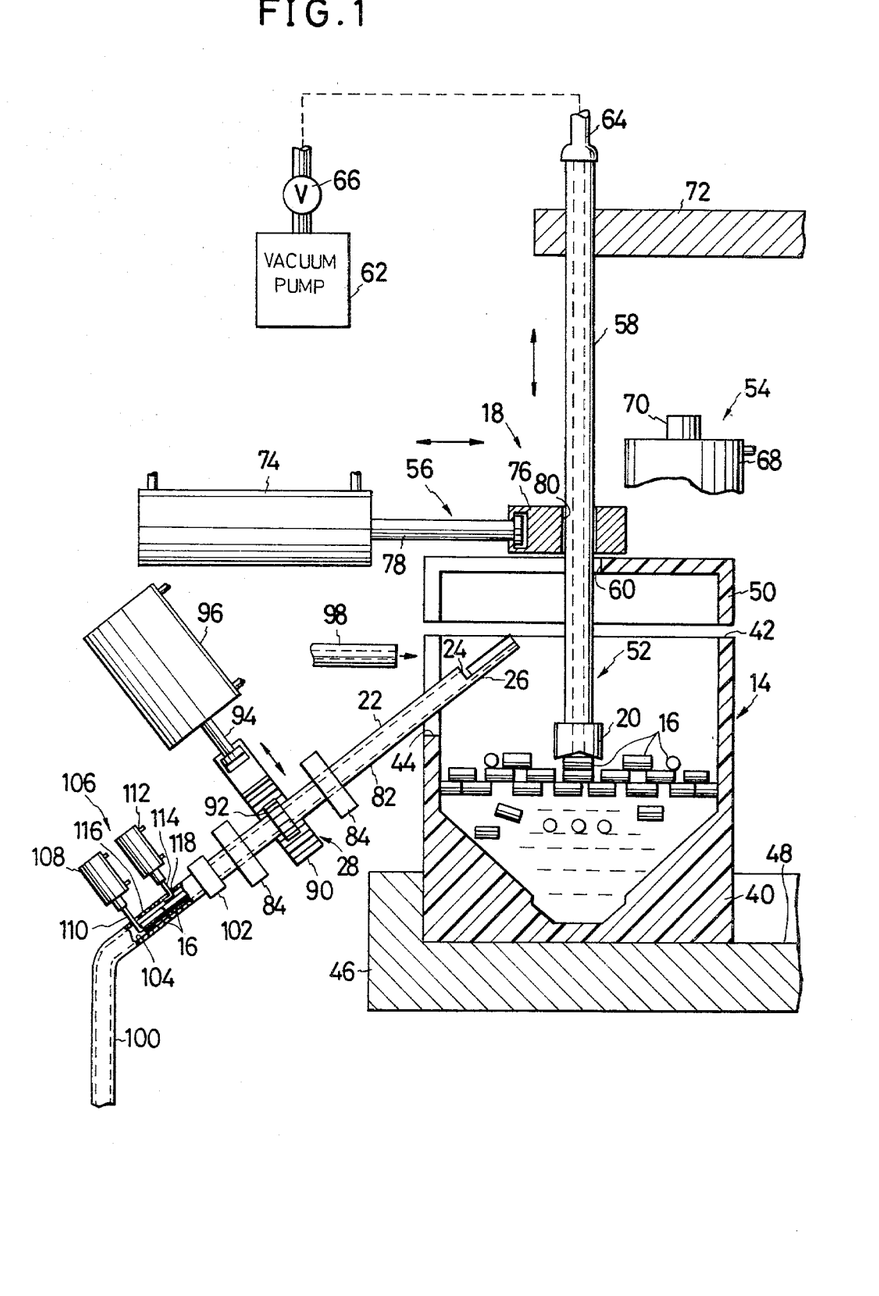
FIG. 1 is a schematic, vertical sectional view, partly in elevation, of a preferred form of the apparatus in accordance with our invention, the view showing the pickup assembly just picking up one of the articles within the receptacle.
Figure 2:
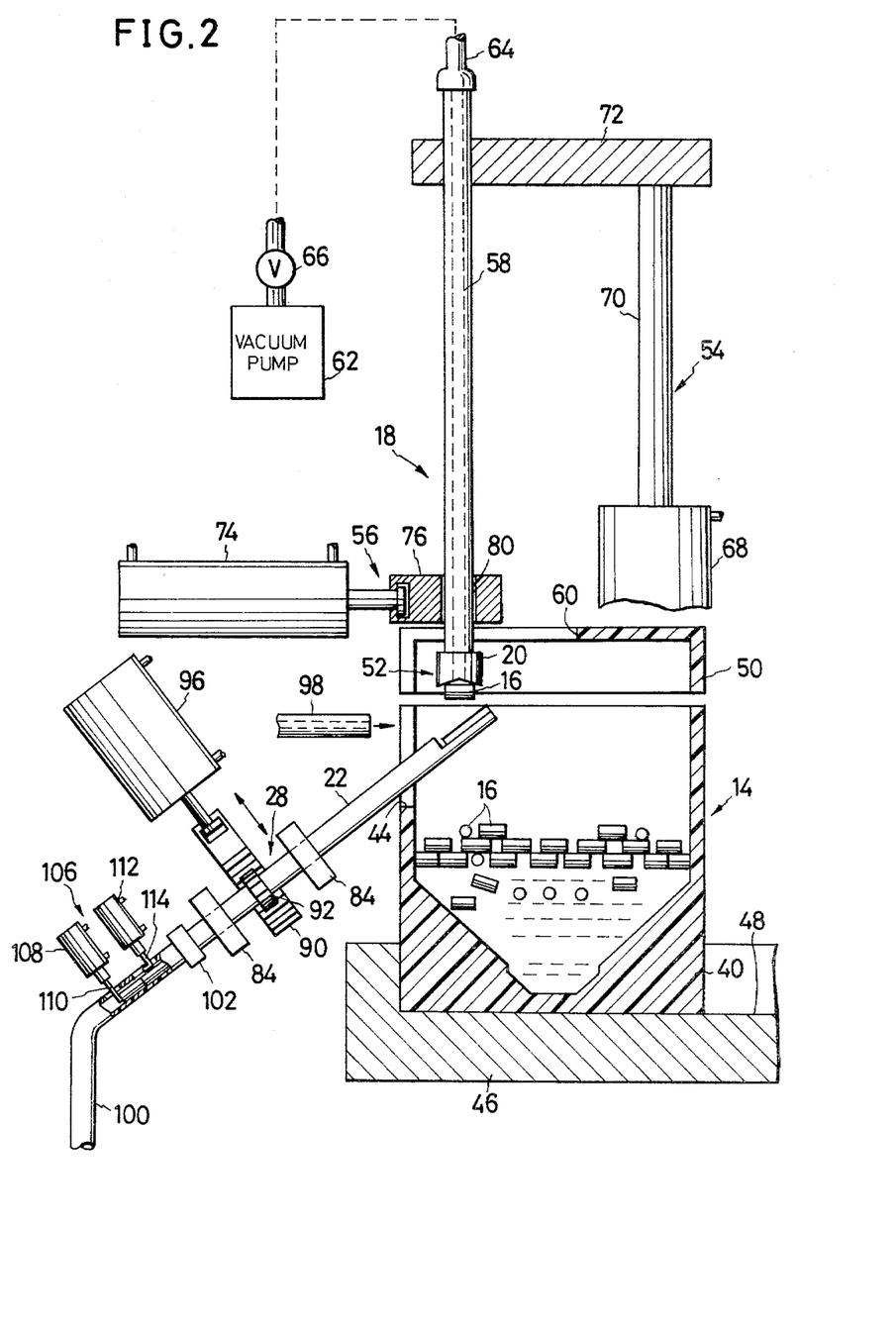
FIG. 2 is a view similar to FIG. 1 except that the pickup assembly is shown ready to deposit the article on the entrance guide.

With reference to both FIGS. 1 and 2 the illustrated apparatus broadly comprises:

1. A receptacle 14 containing a multiplicity of cylindrical or tubular electronic components 16 in random arrangement.
2. A pickup mechanism 18, including a suction head 20, for picking up the electronic components 16 in the receptacle 14 and for dropping the components in a prescribed position, which is within the receptacle 14 in this particular embodiment.
3. An inclined, rotatable, tubular chute 22 for receiving the electronic components 16 at its entrance end 24, projecting into the receptacle 14, and for passing the components therethrough in alignment under their own weight.
4. An entrance guide 26 integrally extending from the entrance end 24 of the chute 22 and lying in the aforesaid prescribed position for guiding the successive electronic components 16 into the chute as they are deposited thereon from the suction head 20 of the pickup mechanism 18.
5. A rack-and-pinion arrangement 28 for imparting bidirectional rotation to the chute 22, and hence to the entrance guide 26, to facilitate the entrance of the electronic components 16 from the entrance guide into the chute, among other purposes.

Figure 3:
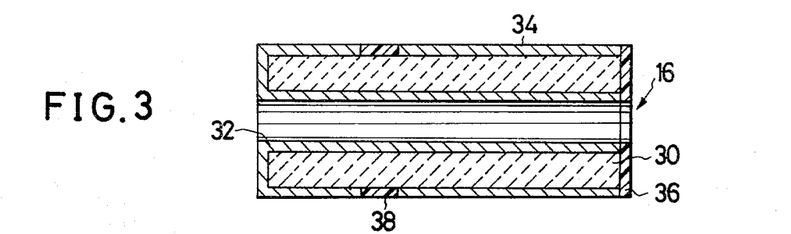
FIG. 3 is an enlarged, axial sectional view of a leadless, tubular ceramic capacitor which can be handled by the apparatus of FIGS. 1 and 2.

As has been mentioned, the electronic components 16 to be handled by the apparatus typically take the form of leadless, tubular ceramic capacitors, each configured as shown in detail in FIG. 3. The capacitor includes a tubular ceramic body 30 having an inner electrode 32 and an outer electrode 34 formed thereon. Two insulating bands 36 and 38 separate the electrodes 32 and 34 from each other. The part of the inner electrode 32 which is formed on the outer surface of the ceramic body 30, and the outer electrode 34, are to be coupled directly to the conductive pattern on a printed circuit board. The capacitor may be as small as two millimeters (mm) in diameter and 7 mm in axial length.

For accommodating a random pile of such electronic components 16, the receptacle 14 of FIGS. 1 and 2 is molded from plastics material into a generally boxlike shape. The bottom 40 of the receptacle 14 is funnel-shaped so that the pickup mechanism 18 may easily take away the electronic components 16 to the last one. The top 42 of the receptacle 14 is open, and a recess 44 is formed in its side wall for the insertion of the entrance guide 26, as well as part of the chute 22, into the receptacle. The receptacle 14 should initially receive the electronic components 16 only to such an extent as to permit the insertion of the entrance guide 26 into the receptacle to a desired degree.

The receptacle 14 is slidably mounted on a guide 46 defining a slideway 48, for moving the receptacle away from the illustrated position as required. During such travel of the receptacle 14 along the slideway 48, both its open top 42 and side recess 44 are to be closed with a suitable cover (not shown). Shown at 50 is a fixed top cover for closing the open top 42 of the receptacle 14 when the latter lies in the illustrated terminal position on the slideway 48.

The pickup mechanism 18 comprises the following three primary components:
1. A vacuum pickup assembly 52 including the noted suction head 20.
2. A vertical drive mechanism 54 for reciprocally moving the pickup assembly 52 in the vertical direction.
3. A horizontal drive mechanism 56 for reciprocally moving the pickup assembly 52 in the horizontal direction.

The suction head 20 of the pickup assembly 52 must pick up one or more electronic components 16 in the central position within the receptacle 14, as shown in FIG. 1, deposit the component or components on the entrance guide 26 in the position of FIG. 2, and return to the FIG. 1 position. The vertical drive mechanism 54 and horizontal drive mechanism 56 coact to cyclically move the suction head 20 between the positions of FIGS. 1 and 2, in the manner hereinafter set forth.

Included in the pickup assembly 52 is an upstanding, rigid suction pipe 58 projecting into the receptacle 14 through the fixed top cover 50 and terminating in the suction head 20. The fixed top cover 50 has formed therein a slot 60 to permit vertical and horizontal movements of the suction pipe 58. The suction pipe 58 communicates with a vacuum pump 62 by way of a flexible conduit 64. A solenoid valve 66 makes on-off control of communication between suction head 20 and vacuum pump 62. Preferably, when actuated to discommunicate the suction head 20 from the vacuum pump 62, the solenoid valve 66 should place the suction head 20 in communication with the atmosphere.

The vertical drive mechanism 54 comprises a fluid actuated cylinder 68 (hereinafter referred to as the vertical drive cylinder) having a piston rod 70 directed upwardly, and an abutment 72 extending horizontally and rigidly coupled to the suction pipe 58 for movement therewith in both vertical and horizontal directions. Upon extension of the vertical drive cylinder 68, therefore, its piston rod 70 moves into abutting, slidable contact with the abutment 72. The continued extension of the vertical drive cylinder 68 results in the upward travel of the pickup assembly 52 with the abutment 72, as shown in FIG. 2.

The horizontal drive mechanism 56 comprises a fluid actuated cylinder 74 (hereinafter referred to as the horizontal drive cylinder) disposed horizontally, and a coupling 76 connecting the piston rod 78 of the horizontal drive cylinder to the suction pipe 58. The coupling 76 has formed therein a bore 80 through which the suction pipe 58 extends slidably. The suction pipe 58 is therefore free to move vertically relative to the piston rod 78 but is rigidly coupled to same in the horizontal direction. A consideration of FIGS. 1 and 2 will reveal that during the extension or contraction of the horizontal drive cylinder 74, the abutment 72 travels with the suction pipe 58 in sliding contact with the piston rod 70 of the vertical drive cylinder 68.

Figure 5:
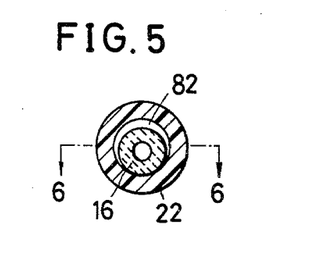
FIG. 5 is a sectional view taken along the line 5—5 of FIG. 4.
Figure 6:
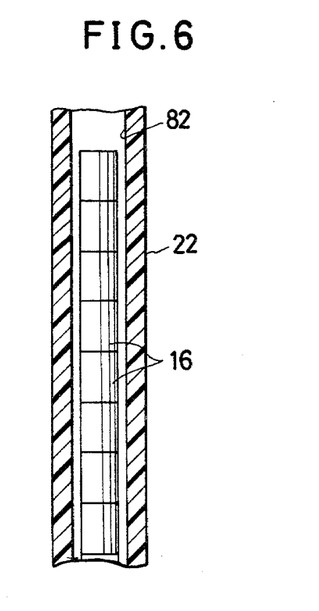
FIG. 6 is a sectional view taken along the line 6—6 of FIG. 5.

Since the illustrated apparatus handles the cylindrical or tubular electronic components 16, the chute 22 takes the form of a tube, having a bore 82 extending therethrough. As will be seen also from FIGS. 4, 5 and 6, the bore 82 has a diameter slightly in excess of the diameter of each electronic component 16, so that the electronic components slide through the chute 22 in axial alignment with each other.

The chute 22 is rotatably supported by a pair of bearing blocks 84, at such an angle that the electronic components 16 slide through the chute under their own weight. For the best results the chute 22 should be inclined at an angle ranging from about 30° to 60°, preferably about 45°, with respect to the plane of the horizon.

Figure 4:
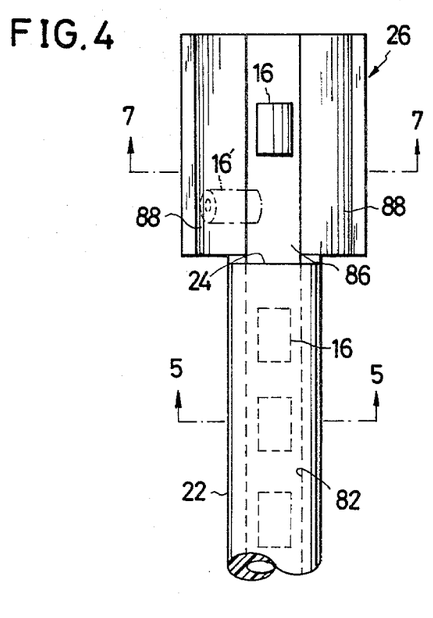
FIG. 4 is an enlarged, partial elevational view of the entrance guide and chute in the apparatus of FIGS. 1 and 2.
Figure 7:
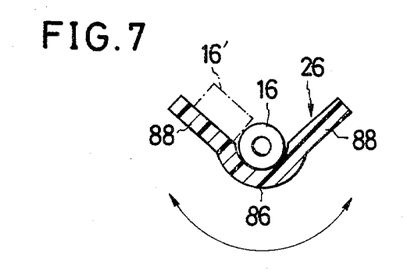
FIG. 7 is a sectional view taken along the line 7—7 of FIG. 4.

As shown in detail in FIGS. 4 and 7, the entrance guide 26 extends from the entrance end 24 of the chute 22 at the same angle of inclination as the chute. The entrance guide 26 is substantially V-shaped in cross section, integrally comprising a trough 86 of semicircular cross section, and a pair of divergent wings 88 on the opposite sides of the trough. The trough 86 has a radius slightly greater than that of each electronic component 16. The pair of divergent wings 88 have an angle therebetween ranging from about 120° to 170°, preferably about 150°.

Dropped from the suction head 20, each electronic component 16 is directed by the entrance guide 26 into the chute 22, with the axis of the component oriented parallel to the axis of the chute. There may be some electronic components that fall on the entrance guide 26 at an angle to the axis of the chute 22, as indicated at 16' in FIGS. 4 and 7. Since the entrance guide 26 as a whole is inclined at the same angle as the chute 22, however, and since its pair of wings 88 are angled divergently, such a component 16' will slide or roll onto the trough 86 and thence will slide axially into the chute.

The vacuum pickup assembly 52 may deposit several components 16 on the entrance guide 26 at one time. Should the entrance guide 26 be left stationary, it might fail to feed such a group of components into the chute 22 one after another solely by virtue of its geometry. The result would be the jamming of the components at the entrance end 24 of the chute 22. A component deposited singly on the entrance guide 26 might also clog the entrance end 24, depending upon its initial orientation on the entrance guide. The illustrated apparatus obviates this possibility by imparting bidirectional rotation to the chute 22 and the entrance guide 26 by means of the rack-and-pinion mechanism 28.

With reference back to FIG. 1 the rack-and-pinion mechanism 28 comprises a rack 90 extending at right angles with the chute 22 and located between the pair of bearing blocks 84 rotatably supporting the chute, and a pinion 92 fixedly mounted on the chute and meshing with the rack. The rack 90 is rigidly coupled to the piston rod 94 of a fluid actuated cylinder 96 (hereinafter referred to as the rack cylinder).

It is thus seen that the extension and contraction of the rack cylinder 96 results in the bidirectional rotation of the chute 22 together with the entrance guide 26. The chute 22 and entrance guide 26 should be thus rotated at least about 90°, preferably from about 90° to 270°, and most desirably about 150°, in each direction. In this manner, regardless of the orientations of the components 16 on the entrance guide 26 just when they are deposited from the pickup assembly 52, the components will be mostly smoothly directed into the chute 22. Moreover, as the entrance guide 26 is bidirectionally rotated more than about 90° in each direction, the components that will not easily slide into the chute 22 can be dropped off the entrance guide into the receptacle 14.

At 98 is shown an air nozzle for expelling air or other gas under pressure against the entrance guide 26 so as to facilitate the entrance of the components 16 into the chute 22. The air nozzle may blow air under periodically varying pressure for the best results. The use of the air nozzle 98, either singly or in combination with the rack-and-pinion mechanism 28, is recommended in cases where the articles being handled by the apparatus will not easily enter the chute 22. The air nozzle will be unnecessary if the articles are leadless capacitors such as the one shown in FIG. 3.

The rotatable chute 22 is communicatively coupled end-to-end to a fixed, tubular chute 100 via a coupling 102 permitting rotation of the rotatable chute relative to the fixed chute. Having a bore 104 similar to the bore 82 of the rotatable chute 22, the fixed chute 100 serves to transport the components 16 to the desired location by gravity.

According to an additional feature of our invention the fixed chute 100 is provided with a delivery control mechanism 106 for delivering the successive components 16 to the desired location at required time intervals. The delivery control mechanism 106 comprises:

1. A first fluid actuated cylinder 108 (hereinafter referred to as the first stop cylinder) carrying a stop pin 110 on its piston rod.

2. A second fluid actuated cylinder 112 (hereinafter referred to as the second stop cylinder) also carrying a stop 114, this one in the form of a leaf spring, on its piston rod.

With the extension and contraction of the first stop cylinder 108 the stop pin 110 moves diametrically into and out of the fixed chute 100 through a clearance hole 116 formed therein. The stop pin 110 when thrusted into the chute 100 acts to prevent the passage of the components 16 therethrough and, on retraction, permits the passage of the components.

Disposed upstream of the stop pin 110, the stop spring 114 also extends into the fixed chute 100 through another clearance hole 118 formed therein. On extension of the second stop cylinder 112 the stop spring 114 presses one of the components 16, lying just upstream of the one being arrested by the stop pin 110, sidewise against the inside surface of the fixed chute 100, thereby locking that particular component and all the succeeding ones against movement. On contraction of the second stop cylinder 112 the stop spring 114 releases the component by moving away therefrom.

The delivery control mechanism 106 operates in the following manner to effect one-by-one delivery of the components 16 to the desired location through the fixed chute 100. Let it be assumed that the first 108 and second 112 stop cylinders are both extended, with the stop pin 110 and stop spring 114 in their illustrated working positions to stop the foremost and the next components 16, respectively, in the fixed chute 100. Upon contraction of the first stop cylinder 108 the stop pin 110 retracts to release the foremost component and hence to permit same to slide through the fixed chute 100 toward the desired location. The stop spring 114, still in its working position, retains all the other components in the rotatable 22 and fixed 100 chutes.

The first stop cylinder 108 is extended upon completion of the delivery of the first component, thereby moving the stop pin 110 back to the working position. Then the second stop cylinder 112 is contracted to cause the stop spring 114 to release the second component, so that this second component moves into engagement with the stop pin 110, with all the succeeding components following the second component. Then the second stop cylinder 112 is extended to cause the stop spring 114 to engage the third component. Then, upon contraction of the first stop cylinder 108, the stop pin 110 permits only the second component to slide through the fixed chute 100 to the desired location. The repetition of such a cycle of operation enables one-by-one delivery of the components 16 at easily controllable time intervals.

Figure 8:
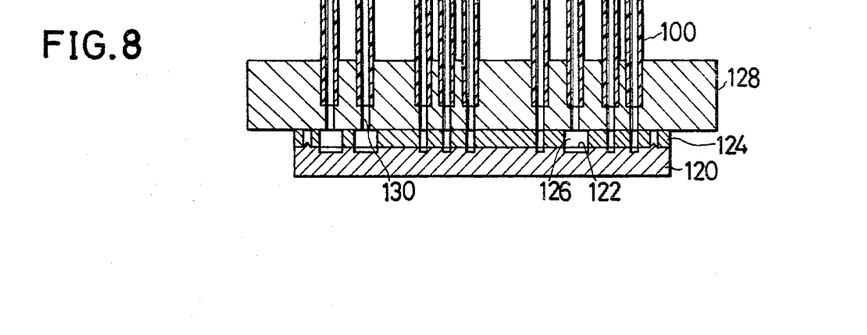
FIG. 8 is a vertical sectional view of means for prearranging electronic components on a template, prior to their attachment to a printed circuit board, the prearranging means being suitable for use with the apparatus of our invention.

In delivering such electronic components to templates, preparatory to the mounting of the components in desired positions on printed circuit boards, a multiplicity of identical apparatus, each constructed as in FIGS. 1 and 2, are to be prepared for simultaneous delivery of the components to each template. FIG. 8 shows a typical arrangement of a template 120 and associated means for receiving the electronic components from the apparatus. The template 120 has formed therein a multiplicity of depressions 122 whose positions correspond to those on each printed circuit board on which the components are to be mounted.

Overlying the template 120 is a guide plate 124 having openings 126 formed therethrough in register with the depressions 122 in the template. Further over the guide plate 124 there is disposed a chute retainer plate 128 holding the ends of the fixed chutes 100. The chute retainer plate 128 has also formed therein bores 130 communicating the chutes 100 with the respective openings 126 in the guide plate 124.

The electronic components are to be fed through the fixed chutes 100 into the spaces provided by the depressions 122 in the template 120 and the openings 126 in the guide plate 124. The template 120 and guide plate 124 are to be vibrated for properly orienting the components in the noted spaces. It will of course be seen that the apparatus according to our invention also finds use in cases where the electronic components are delivered directly to printed circuit boards.

OPERATION

Figure 9:
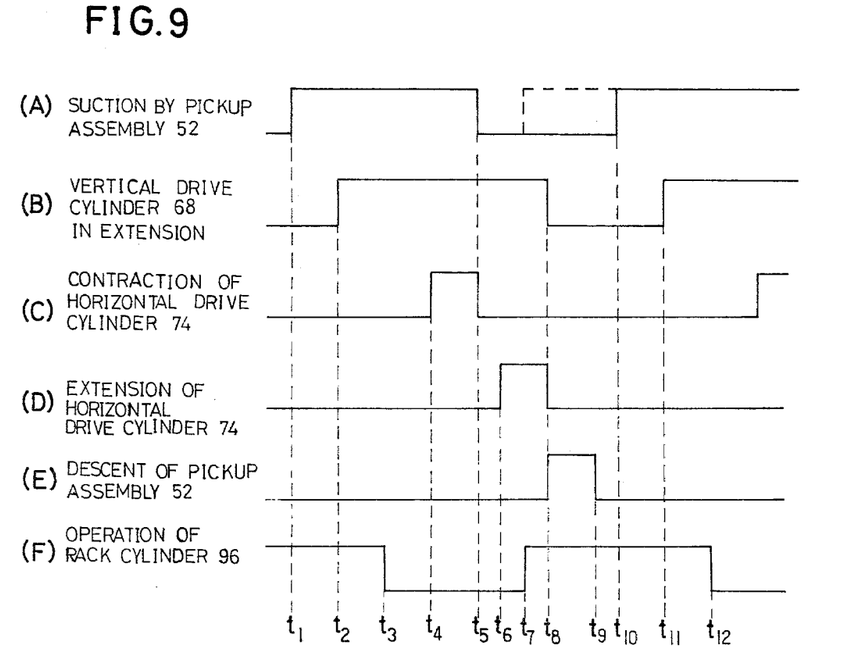
FIG. 9 is a time chart explanatory of the operation of the apparatus of FIGS. 1 and 2.

Reference is now directed to the time chart of FIG. 9 in order to describe the operation of the apparatus shown in FIGS. 1 and 2. In FIG. 9 the characters t1 through t12 indicate the successive moments in time. As represented at (A) in FIG. 9, the vacuum pickup assembly 52 starts exerting suction on the electronic components 16 in the receptacle 14 at moment t1 when its suction head 20 lies immediately over the components, as in FIG. 1, or thereabout. At least one component 16 will adhere to the suction head 20.

Then, as indicated at (B) in FIG. 9, the vertical drive cylinder 68 is extended at moment t2 thereby causing its piston rod 70 to raise the pickup assembly 52, together with the component 16 held sucked by its suction head 20, to the height of FIG. 2 via the abutment 72. The vertical drive cylinder 68 is held extended (until moment t8 to be explained presently) to retain the pickup assembly 52 at the height of FIG. 2.

Then, as shown at (C) in FIG. 9, the horizontal drive cylinder 74 is contracted at moment t4, so that the pickup assembly 52 travels leftward to the position of FIG. 2. The horizontal drive cylinder 74 completes contraction at moment t5 when the pickup assembly 52 reaches the position of FIG. 2, with the suction head 20 located just over the entrance guide 26. At the same moment t5, as will be seen from (A) in FIG. 9, the solenoid valve 66 is actuated to block communication between suction head 20 and vacuum pump 62, preferably placing the suction head in communication with the atmosphere as aforesaid. Thereupon the suction head 20 drops the component 16 onto the entrance guide 26.

The component 16 will immediately slide into the rotatable chute 22 if it falls neatly on the central trough 86 of the entrance guide 26, as depicted by the solid lines in FIG. 4, thanks to the inclination of the entrance guide and chute. If the component falls on either of the two wings 88 of the entrance guide 26, the component will first slide or roll down into the trough 86 and thence slide into the chute 22.

The pickup assembly 52 can be returned to the position of FIG. 1 immediately upon deposition of the component 16 on the entrance guide 26. The extension of the horizontal drive cylinder 74 is therefore started at the same moment t5 as the closure of the solenoid valve 66 or, as noted at (D) in FIG. 9, at a slightly latter moment t6. The horizontal drive cylinder 74 completes extension at moment t8 when the pickup assembly 52 returns to the center of the receptacle 14.

Also, at moment t8 or thereabout, the vertical drive cylinder 68 is contracted, as at (B) in FIG. 9, to permit the descent of the pickup assembly 52 together with the abutment 72. The pickup assembly 52 descends under its own weight during the time from moment t8 to moment t9, as represented at (E) in FIG. 9. The descent of the pickup assembly 52 terminates when its suction head 20 rests upon the stock of components 16 in the receptacle 14.

The pickup assembly 52 is now ready to pick up the next component or components. At moment t10 slightly later than moment t9, therefore, the solenoid valve 66 is opened to cause the suction head to suck one or more components 16. Then, at moment t11, the vertical drive cylinder 68 is again extended to raise the pickup assembly 52 together with the component or components. Thus the second cycle of operation proceeds just like the above described first cycle.

Each component 16, dropped onto the entrance guide 26 from the pickup assembly 52 as at moment t5 in FIG. 9, might not smoothly enter the chute 22 if the entrance guide and chute remained stationary. Some components, moreover, may fall on the entrance guide 26 with their axes at right angles with the axis of the chute 22, thus possibly clogging the entrance end 24 of the chute. The rack-and-pinion mechanism 28 functions as in the following to prevent the components from jamming on the entrance guide 26.

As plotted at (F) in FIG. 9, the rack cylinder 96 operates from moment t7, slightly after the deposition of the component on the entrance guide 26, to moment t12, which follows the moment t11 when the vertical drive cylinder 68 recommences extension. According to one preferred mode of operation the rack cylinder 96 is extended during the first half of the period t7–t12 thereby causing the rack-and-pinion mechanism 28 to rotate the chute 22, and therefore the entrance guide 26, in one direction through an angle of 150°. The rack cylinder 96 is contracted during the second half of the same period, with the consequent 150° rotation of the chute 22 and entrance guide 26 in the opposite direction, back to the initial angular position. Moment t3 in FIG. 9 marks the end of the preceding bidirectional rotation of the chute 22 and entrance guide 26.

Such bidirectional rotation of the entrance guide 26 serves to facilitate the entrance of the components into the chute 22 on one hand and, on the other hand, to drop off the entrance guide the components that will not enter the chute. There will therefore be no jamming component or components left on the entrance guide 26 when the pickup assembly 52 deposits the next component or components thereon. The bidirectional rotation of the chute 22 also helps to make smoother the travel of the components therethrough.

The delivery control mechanism 106 on the fixed chute 100 functions as above explained to enable one-by-one delivery of the components 16 at controllable time intervals. The components are thus delivered to templates, such as the one shown at 120 in FIG. 8, or directly to printed circuit boards.

The apparatus of FIGS. 1 and 2, constructed and operated as in the foregoing, possesses the following advantages:

1. The aligned delivery of electronic components from one location to another is possible as the components are successively picked up from the receptacle 14 and dropped on the entrance guide 26.
2. The entrance guide 26 of substantially V-shaped cross section permits easy entrance into the chute 22 of the electronic components deposited thereon.
3. The electronic components that will not readily enter the chute 22 can be dropped from the entrance guide 26 by revolving same with the chute. The revolution of the entrance guide and chute also serves to readjust the components on the entrance guide into axial alignment with the chute and to make smoother the travel of the components through the chute.
4. Since the entrance guide 26 projects into the receptacle 14, the components that have been shaked off the entrance guide drop in the receptacle itself, so that they can be picked up and placed again on the entrance guide by the pickup assembly 52.
5. The receptacle 14 with its funnel-shaped bottom 40 enables the pickup assembly 52 to carry away all the components simply as the pickup assembly moves up and down in the central position of the receptacle.
6. The receptacle 14 is slidably mounted on the guide 46 for the ease of replenishment.
7. The delivery control mechanism 106 permits one-by-one delivery of the components to a desired location at desired time intervals.

MODIFICATIONS

Figure 10:
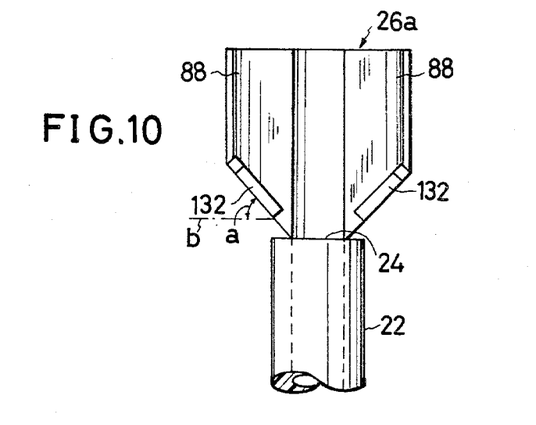
FIG. 10 is an elevational view of a modified entrance guide shown together with part of the chute.

FIG. 10 shows a modified entrance guide 26a, in which the pair of divergent wings 88 are formed to include a pair of guide rims 132 at their ends opposite to the entrance end 24 of the rotatable chute 22. The pair of guide rims 132 converge toward the entrance end of the chute. The angle a between each guide rim 132 and a line b at right angles with the axis of the chute can be anywhere in the range of about 20°-60° and, for the best results, 45° or so. The entrance guide 26a with its pair of converging guide rims 132 will more positively guide electronic components or other articles into the chute.

Figure 11:
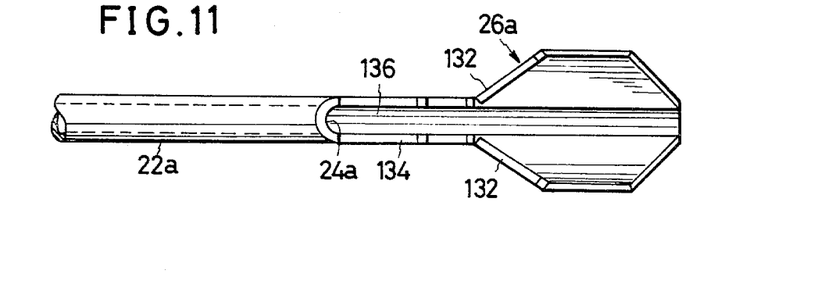
FIG. 11 is an elevational view of another modified combination of entrance guide and chute.
Figure 12:
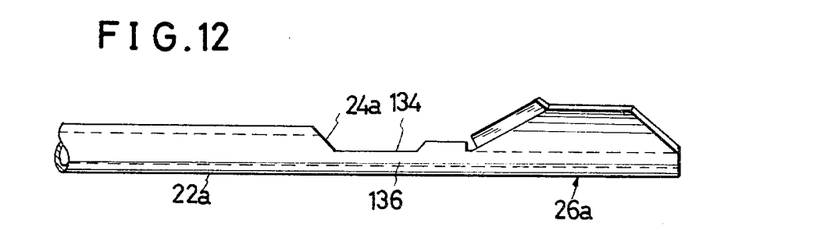
FIG. 12 is a side elevational view of the structure of FIG. 11.
Figure 13:
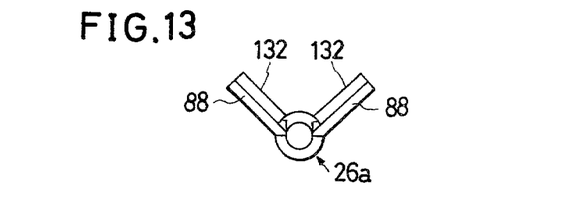
FIG. 13 is a right hand end elevational view of the structure of FIG. 12.

FIGS. 11, 12 and 13 illustrate the entrance guide 26a, essentially identical with that shown in FIG. 10, in combination with a modified rotatable chute 22a. The modification resides in a longitudinal recess 134 formed in a part of the chute 22a, the recessed part of the chute being thus converted into an upwardly open trough portion 136. This trough portion can be thought of as extending between the entrance guide 26a and the entrance end 24a of the chute 22a. The trough portion 136 lends itself to combination, of course, with the entrance guide 26 of FIGS. 4 and 7.

Although we have shown and described our invention in terms of one specific embodiment and modifications thereof, additional modifications and variations of the invention will readily occur to one skilled in the art. For example, in carrying successive electronic components or other articles from receptacle 14 to entrance guide 26, the pickup assembly 52 may be swung in the pendulum fashion, possibly after having been raised vertically as required. Further the chute 22 and entrance guide 26 may be vibrated in one or more directions to help the articles enter the chute in alignment, to drop the articles from the entrance guide, and to expedite the travel of the articles through the chute.

Further, instead of the rack-and-pinion mechanism 28, a gear train may be employed to rotate the chute 22 and entrance guide 26 through an angle of 360°, or even more, after the pickup assembly 52 deposits one or more articles on the entrance guide each time. It is also possible to employ electric actuators such as solenoids and motors in place of the fluid actuated cylinders 62, 68, 74, 96, 108 and 112.

Still further the chutes 22 and 100 may be molded of transparent material for visual inspection of the state of delivery of the articles therethrough. Suitable slots may be formed in the chutes 22 and 100 for manual correction of any jamming articles. If desired, moreover, the entrance guide 26 may be disposed outside the receptacle 14. In this case the articles that have been dropped from the entrance guide may be recovered in a separate container and returned to the receptacle 14.

All these and other modifications and variations of our invention within the usual knowledge of the specialists are understood to fall within the scope of the invention as set forth in the appended claims.

What we claim is:

1. An apparatus for transferring articles from one location, where the articles are held in a random pile, to another location in a row, the apparatus comprising:
    (a) a receptacle in said one location for receiving the articles;
    (b) pickup means for repeatedly picking up the articles, at least one at a time, in the receptacle and depositing the articles in a predetermined position;
    (c) an inclined chute for receiving the articles one at a time at an entrance end thereof and conveying the articles in a row therethrough toward said other location;
    (d) an entrance guide of substantially V-shaped cross section extending from the entrance end of the chute and lying in said predetermined position for directing the articles, as they are deposited on the entrance guide by the pickup means, into the chute; and
    (e) means for rotating the chute and the entrance guide about the axis of the chute after the pickup means deposits at least one article on the entrance guide each time, in order to facilitate the entrance of the articles from the entrance guide into the chute.

2. The apparatus as recited in claim 1, wherein the pickup means comprises:
    (a) a vacuum pickup assembly including a suction head for causing adhesion of the articles thereto by suction; and
    (b) means for moving the suction head of the pickup assembly between said predetermined position and a position within the receptacle where the articles are sucked by the suction head.

3. The apparatus as recited in claim 2, wherein the pickup assembly further comprises a rigid suction pipe extending upwardly from the suction head, and wherein the moving means comprises:
(a) an abutment rigidly coupled to the suction pipe and generally extending horizontally;
(b) a first actuator disposed vertically and movable into and out of abutting contact with the abutment for imparting up-and-down motion to the suction head;
(c) a second actuator disposed horizontally; and
(d) means for coupling the second actuator to the suction pipe so as to permit the former to move the latter horizontally, the coupling means permitting the suction pipe to move vertically therethrough.

4. The apparatus as recited in claim 1, wherein the chute is inclined at an angle ranging from about 30° to 60° with respect to the plane of the horizon, and wherein the entrance guide is inclined at the same angle as the chute.

5. The apparatus as recited in claim 1, wherein the entrance guide comprises:
(a) a trough of semicircular cross section; and
(b) a pair of divergent wings formed on the opposite sides of the trough.

6. The apparatus as recited in claim 5, wherein the pair of divergent wings have an angle therebetween ranging from about 120° to 170°.

7. The apparatus as recited in claim 5, wherein the entrance guide further comprises a pair of guide rims formed on those ends of the divergent wings which lie opposite to the entrance end of the chute, the guide rims converging toward the entrance end of the chute.

8. The apparatus as recited in claims 1, 5 or 7, further comprising a trough portion extending between the entrance guide and the chute.

9. The apparatus as recited in claim 1, wherein the rotating means rotates the chute and the entrance guide at least about 90° in one direction and then through the same angle in the opposite direction each time.

10. The apparatus as recited in claim 1, further comprising means for delivering the articles one by one at controllable time intervals through the chute toward said other location.

11. The apparatus as recited in claim 10, wherein the delivering means comprises:
(a) first stop means for releasably locking against movement one article in the chute; and
(b) second stop means for releasably locking against movement all the succeeding articles in the chute.

12. The apparatus as recited in claim 1, wherein the entrance guide is disposed within the receptacle.

13. An apparatus for transferring cylindrical or tubular articles, such as some electronic components, from one location to another in an aligned manner, the apparatus comprising:
(a) a pickup assembly for repeatedly picking up the articles, at least one at a time, in said one location and depositing the articles in a predetermined position;
(b) means for moving the pickup assembly between said predetermined position and a position for picking up the articles;
(c) an inclined, rotatable chute having a bore therethrough for receiving the articles in alignment at an entrance end thereof and conveying the articles toward said other location;
(d) an entrance guide comprising a trough of semicircular cross section and a pair of divergent wings formed on the opposite sides of the trough, the entrance guide integrally extending from the entrance end of the chute for simultaneous rotation therewith and being inclined at the same angle as the chute, the entrance guide being disposed in said predetermined position for directing the articles, as they are deposited thereon by the pickup assembly, into the chute; and
(e) means for imparting rotation to the chute and the entrance guide in order to facilitate the entrance of the articles from the entrance guide into the chute.

14. The apparatus as recited in claim 13, further comprising:
(a) a fixed chute communicatively coupled end-to-end to the rotatable chute for conveying the aligned articles to said other location therethrough;
(b) first stop means for releasably locking against movement one article in the fixed chute; and
(c) second stop means for releasably locking against movement all the succeeding articles in the fixed and rotatable chutes;
(d) whereby the articles can be delivered one by one to said other location at controllable time intervals.

* * * * *